United States Patent [19]

Frederiksen et al.

[11] Patent Number: 4,607,172
[45] Date of Patent: Aug. 19, 1986

[54] BIPOLAR STROBED TRANSISTOR LATCH FOR A HIGH GAIN COMPARATOR

[75] Inventors: Thomas M. Frederiksen, San Jose; Daniel D. Culmer, Santa Clara, both of Calif.

[73] Assignee: National Semiconductor Corporation, Santa Clara, Calif.

[21] Appl. No.: 579,636

[22] Filed: Feb. 13, 1984

[51] Int. Cl.⁴ .................. H03K 3/35; H03K 3/356
[52] U.S. Cl. .................... 307/291; 307/455; 307/494; 307/272 R; 307/289; 357/65; 365/207
[58] Field of Search ............. 307/443, 454, 455, 466, 307/467, 494, 498, 352, 353, 243, 272 R, 276, 289, 291, 299 B, 530; 357/34, 36, 65; 365/154, 174, 207

[56] References Cited

U.S. PATENT DOCUMENTS

| | | | |
|---|---|---|---|
| 3,728,560 | 4/1973 | Treadway | 307/289 |
| 4,193,007 | 3/1980 | Tietz | 307/291 |
| 4,339,765 | 7/1982 | Nakamura et al. | 357/36 |
| 4,491,745 | 1/1985 | Birch | 307/443 X |
| 4,506,171 | 3/1985 | Evans et al. | 307/494 X |
| 4,513,283 | 4/1985 | Leininger | 307/467 X |
| 4,532,440 | 7/1985 | Barre | 307/467 X |

Primary Examiner—Stanley D. Miller
Assistant Examiner—D. R. Hudspeth
Attorney, Agent, or Firm—Gail W. Woodward; Paul J. Winters

[57] ABSTRACT

A differential amplifier is combined with a latch in a stage suitable for use in high speed comparators. An IC topography for the latch is also shown.

7 Claims, 4 Drawing Figures

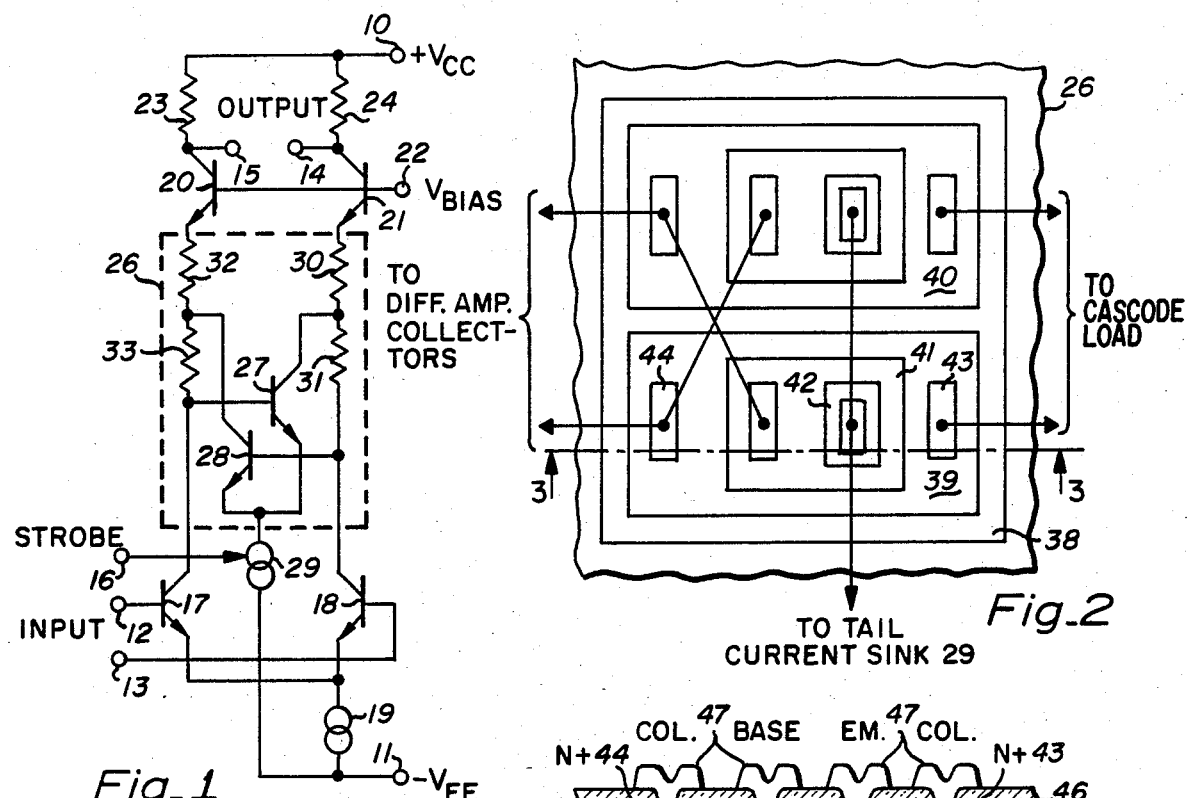
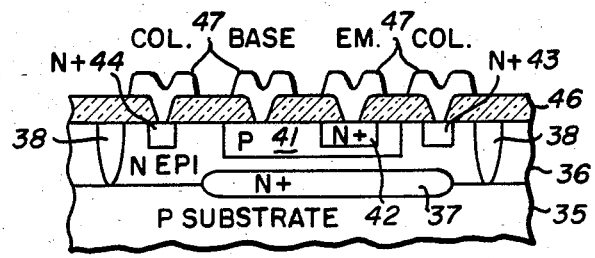
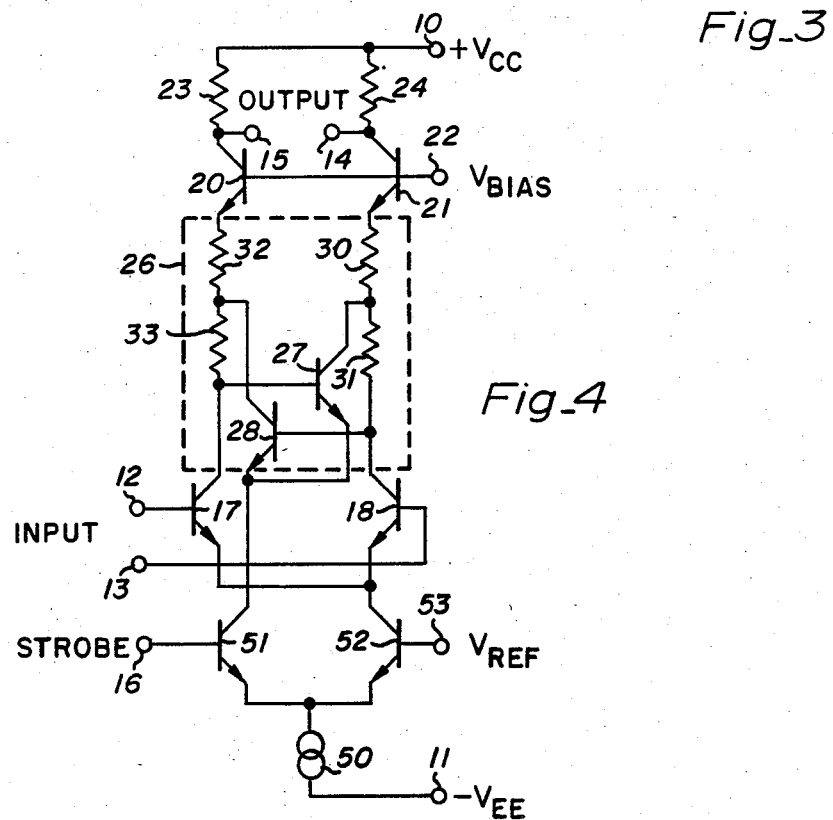

BIPOLAR STROBED TRANSISTOR LATCH FOR A HIGH GAIN COMPARATOR

BACKGROUND OF THE INVENTION

The invention relates to high gain comparators which produce a digital output in response to the sense of an analog differential input. Such circuits often include a latch that can be actuated as desired to hold the digital output in response to the input state at the time of the hold command. Comparator sensitivity is a function of gain and it is common practice to cascade a plurality of differential amplifiers to achieve the desired gain. However, since speed of response will be limited with such cascading a compromise must be achieved between speed and sensitivity. The latching function is commonly applied to the second or third cascaded amplifier stage. The latch is normally inactive so the comparator output continuously indicates the input state. Upon latch command it locks the circuit up in the state represented by the input conditions at the time the latch is turned on. This will hold as long as the latch is on. Thus, a sample and hold function is available in the comparator. The latch on command is commoly called a strobe signal. Ideally, the latch circuitry will have no deleterious effect upon the amplifying circuitry when turned off but will dominate the signal control when turned on. As a practical matter, the latch and signal amplifying circuits can adversely react upon each other in practical circuit.

SUMMARY OF THE INVENTION

It is an object of the invention to incorporate a latching circuit in a differential amplifier wherein the latch can be turned off and not have an adverse effect upon the amplifier.

It is a further object of the invention to incorporate a latch composed of a pair of transistors into a differential amplifier with each of the transistors of this differential amplifier having a pair of spaced-apart collector contacts connected to conduct the current flowing in the differential amplifier.

It is a still further object of the invention to differentially interconnect a pair of transistors, each one of which has a pair of spaced-apart collector contacts, and to connect the collector contact pairs in series with the collectors of a latching differential amplifier so that when this pair is supplied with tail current it will latch the amplifier into its conductive state as of the time the tail current was first applied.

These and other objects are achieved in the following manner. A differential amplifier stage is made up of a differential transistor pair, a tail current supply and a cascode-connected transistor load circuit. A pair of cross-coupled transistors; with each one having paired, spaced-apart, collector contacts, is connected in series with the collectors of the amplifier pair. When the cross coupled transistors are turned off, the collector contacts couple the amplifier pair to its cascode load and normal amplifier action occurs. When the cross coupled pair is supplied with tail current, they will latch up and hold the amplifier stage in the state that was present when the tail current was first turned on. The latch will hold the amplifier stage in the predetermined state as long as the tail current flows.

In a preferred embodiment, a control circuit acts to reduce the amplifier current by the amount of the tail current in the latch when the latch is turned on. This ensures that the cascode load receives the same current whether the latch is on or off.

This latching amplifier configuration can be applied to any of the stages in a plural stage differential amplifier cascode. In the interests of sensitivity it is usually connected into the second or third stage of a three stage amplifier.

BRIEF DESCRIPTION OF THE DRAWING

FIG. 1 is a schematic diagram of a differential amplifier stage incorporating a latch according to the invention.

FIG. 2 is a topological showing of the IC implementation of the latch portion of the circuit of FIG. 1.

FIG. 3 is a cross section of the IC shown in FIG. 2.

FIG. 4 is a schematic diagram of a preferred embodiment of the invention.

DESCRIPTION OF THE INVENTION

FIG. 1 is a schematic diagram of a differential amplifier and latch combination. The stage is operated from a power supply connected + to $V_{CC}$ terminal 10 and − to $V_{EE}$ terminal 11. While a ground terminal is not shown, the ground level will be present at some potential intermediate between $V_{CC}$ and $V_{EE}$. An input signal, applied differentially between terminals 12 and 13 will appear amplified between terminals 14 and 15. A strobe input signal at terminal 16 can activate the latch at which point the output terminals will maintain the potentials that were present when latching occurred.

Transistors 17 and 18 are coupled together differentially and their tail current flows in constant current sink 19. Transistors 20 and 21 are cascode connected to transistors 17 and 18 to form a load structure biased by a constant voltage ($V_{BIAS}$) applied to terminal 22. Resistors 23 and 24 complete the load circuit and the amplifier stage output voltage appears acros them.

In a typical circuit operation, terminal 22 is biased one diode, or $V_{BE}$, above the power supply ground. Thus, the emitters of transistors 20 and 21 will be operated very close to ground potential. The signals appearing at terminals 14 and 15 will swing between $V_{CC}$ and $V_{SAT}$. This means that either/or both terminal 14 and 15 can develop a digital output that represents the voltage comparison at input terminals 12 and 13. The sensitivity of this voltage comparison is determined by the amplifier gain. If desired additional amplifier stages can be coupled ahead of the input terminals to increase comparison sensitivity.

Dashed outline 26 shows the associated latch. Differentially connected transistors 27 and 28 are shown cross coupled in latching configuration. The tail current flows in constant current sink 29, which can be switched off and on by a control voltage or strobe on terminal 16. Typically, when terminal 16 is high, current sink 29 will conduct and the latch will be operated. When terminal 16 is low, current sink 29 will not conduct and the latch will be inoperative. Transistor 27 and 28 are each fabricated to have two collector terminals, which present a substantial resistance between them so as to create resistors 30–33. These resistors are coupled between the collectors of transistor 17 and 18 and the emitters of transistors 20 and 21. These resistor pairs form conductive paths between the differentially connected amplifier transistors and the cascode load transistors. Resistors 30–33 provide the voltage drops necessary for the operation of latch 26.

As described above, the emitters of transistors 20 and 21 represent low impedances: they are essentially constant voltage terminals. If latch transistors were coupled directly into these terminals, latch operation would be highly unreliable because of insufficient loop gain. For example, the voltage gain of a common-emitter transistor operating into a common-base stage has a gain close to unity, when measured at the emitter (or input) of the common-base stage. In order for a latch to operate, the loop gain must exceed unity. In terms of transistor 27, resistor 30 provides a load element and the voltage gain can be made substantially greater than unity. Resistor 31 couples the collector voltage to the base of transistor 28 to complete the latch. Thus, the presence of resistors 30 and 32 makes latching reliable.

Unfortunately, large voltage drops across these load resistors restrict the upper range of the input common-mode voltage than can be applied to the input differential amplifier. The key idea of this invention is to make use of the unavoidable collector resistance that is associated with the IC input differential amplifier transistors to form the load resistors for the added latching circuit by making use of additional means of contacting to the collector regions of these input transistors. In this way, the required loop gain is achieved for the added latching circuit without degrading the common-mode voltage range at the input to the comparator.

The only requirement for the circuit shown is that current sink 29 must conduct more heavily than current sink 19. This will ensure that when the latch is on, it cannot be overpowered by the amplifier. To ensure a secure latch operation, current sink 29 is made to conduct at least 50% more current than current sink 19.

FIGS. 2 and 3 show an IC structure suitable for use as latch 26 of FIG. 1. FIG. 2 shows the IC topography and FIG. 3 is a cross section of FIG. 2 taken at line 3. The IC construction shown is the conventional planar, PN junction isolated, monolithic silicon form as is well-known in the art. A p-type substrate 35 has an N-type epitaxial layer 36 grown thereon. An N+ buried layer 37 lies under the epitaxial layer.

A p+ isolation diffusion 38 extends completely through epitaxial layer 36 thereby isolating a pair of N-type tubs 39 and 40 of epitaxial material. Transistors 27 and 28 will be built into these tubs.

With reference to tub 39, the structure of transistor 27 will now be detailed. In the showing of FIG. 2, the topside metallization and planar oxide are omitted for clarity and the circuit interconnections are shown schematically. Region 41 represents a P-type transistor base diffused into tub 39. Region 42 represents an N+ transistor emitter diffused within the confines of base 41. N+ collector contact diffusions 43 and 44 make ohmic contact to the collector material tub 39. It can be seen from FIG. 3 that contact 43 lies over buried layer 37 while contact 44 lies beyond the edge of buried layer 37. This means that resistor 30, which represents the resistance between contact 43 and layer 37, is smaller than resistor 31 which represents the resistance between contact 44 and layer 37. Using a typical IC NPN transistor geometry, resistor 30 (the load resistor for the latch circuit) will be about 45 ohms (to provide sufficient loop gain) and resistor 31 about 80 ohms. Resistor 31 is in series with the relatively high input impedance that exist at the base of the latching circuit and therefore does not degrade latch operation.

From the structure disclosed, it is clear that the actual transistor collector exists in layer 37, which is not directly available externally. FIG. 3 also shows the planar oxide 46 which is present to passivate the silicon surface. The various regions to be contacted on the IC are exposed by holes produced therein. Metallization 47 makes contact to the transistor emitter 42, base 41, and collectors 43 and 44.

FIG. 4 represents a preferred embodiment of the invention (where the parts are the same as those of FIG. 1 the same numbers are employed). It can be seen that the differential amplifier, cascode load, and latch are as was described above. However, both the latch and differential amplifier are operated from a single current sink 50. Transistors 51 and 52 are coupled differentially with current sink 50 providing their tail current. The base of transistor 51 is coupled to strobe terminal 16 and the base of transistor 52 is coupled to a constant reference voltage $V_{REF}$ at terminal 53. $V_{REF}$ is chosen to be intermediate between the high and low states of the strobe signal voltage at terminal 16. When the strobe is high, transistor 51 is on and the tail current flows in latch 26, which will thereby be on. When the strobe is low, the latch will be off, and the tail current will flow in transistor 52, which is coupled to the input differential amplifier. Thus, the constant current in sink 50 will flow either in the amplifier or in the latch. This means that the current flowing in the cascode load will be relatively constant whether the latch is operative or not.

The invention has been described and a preferred embodiment shown. When a person skilled in the art reads the foregoing description, alternatives and equivalents, within the spirit and intent of the invention, will become apparent. Accordingly, it is intended that the scope of the invention be limited only by the following claims.

We claim:

1. A differential amplifier and latch combination comprising:

first and second power supply terminals connectable to a source of operating power;

first and second transistors having their emitters coupled together and returned through a first constant current device to said second power supply terminal, their bases coupled to a source of input signal, and their collectors coupled via a cascode load to said first power supply terminal;

third and fourth transistors, each having an emitter, a base, and a pair of collector contacts having appreciable resistance therebetween;

means coupling the pair of collectors in said third transistor in series between said collector of said first transistor and said cascode load;

means coupling the pair of collectors in said fourth transistor in series between said collector of said second transistor and said cascode load;

means coupling the emitters of said third and fourth transistors together and to a second constant current device which couples said emitters to said second power supply terminal;

means for cross coupling said bases of said third and fourth transistors to the opposing collectors, thereby creating a latch; and means for switching said second constant current device on and off in response to a strobe signal input whereby said third and fourth transistors can be turned on to activate said latch and off to disable said latch.

2. The combination of claim 1 wherein said first constant current device conducts less current than said second constant current device.

3. The combination of claim 1 wherein said first and second constant current devices comprise fifth and sixth transistors having their emitters coupled together and by way of a third constant current device to said second power supply terminal; said fifth and sixth transistors having their collectors respectively coupled to the common third and fourth transistor emitters and to the common first and second transistor emitters;

means for coupling the base of said fifth transistor to said source of strobe signal input; and means for coupling the base of said sixth transistor to a reference potential that lies between the voltage extremes of said strobe signal.

4. The combination of claim 1 wherein said cascode load includes a pair of transistors having their bases biased at one $V_{BE}$ above ground whereby their emitters are biased at close to ground potential.

5. A differential amplifier and latch combination circuit comprising:

a differential amplifier having a pair of input terminals coupled to receive an input signal, a pair of transistor emitters coupled in common to a constant tail current supply and a pair of transistor collectors coupled to a cascode load;

a pair of latch transistors cross-coupled together in latching configuration each one of said latch transistors including a pair of collector contacts having substantial resistance therebetween and coupled to said differential amplifier transistor collectors whereby their conduction can dominate the current in said cascode load, and operated from a strobed tail current supply; and means for switching said strobed tail current supply off and on whereby said latch can be turned off and on in response to a strobe command signal.

6. The circuit of claim 5 wherein said strobed tail current supply conducts more current than said differential amplifier tail current supply.

7. The circuit of claim 5 wherein said differential amplifier tail current supply is operated differentially with respect to said strobed tail current supply.

* * * * *